(12) United States Patent
Meyer et al.

(10) Patent No.: US 10,557,908 B2
(45) Date of Patent: Feb. 11, 2020

(54) MAGNETIC FIELD MONITORING OF SPIRAL ECHO TRAIN IMAGING

(71) Applicants: University of Virginia Patent Foundation, Charlottesville, VA (US); Siemens Healthcare GmbH, Erlangen (DE)

(72) Inventors: Craig H. Meyer, Charlottesville, VA (US); John P. Mugler, III, Charlottesville, VA (US); Samuel W. Fielden, Lewisburg, PA (US); Gudrun Ruyters, Erlangen (DE); Berthold Kiefer, Erlangen (DE); Josef Pfeuffer, Erlangen (DE)

(73) Assignee: University of Virginia Patent Foundation, Charlottesville, VA (US)

( * ) Notice: Subject to any disclaimer, the term of this patent is extended or adjusted under 35 U.S.C. 154(b) by 124 days.

(21) Appl. No.: 15/947,443

(22) Filed: Apr. 6, 2018

(65) Prior Publication Data

US 2018/0292499 A1 Oct. 11, 2018

Related U.S. Application Data

(60) Provisional application No. 62/482,406, filed on Apr. 6, 2017.

(51) Int. Cl.
*G01R 33/561* (2006.01)
*G01R 33/563* (2006.01)
(Continued)

(52) U.S. Cl.
CPC ..... *G01R 33/5615* (2013.01); *G01R 33/4818* (2013.01); *G01R 33/56308* (2013.01); *G01R 33/56518* (2013.01)

(58) Field of Classification Search
CPC .......... G01R 33/5615; G01R 33/56308; G01R 33/4818
See application file for complete search history.

(56) References Cited

U.S. PATENT DOCUMENTS 5,402,067 A † 3/1995 Pauly
9,823,324 B2 * 11/2017 Pfeuffer ............... G01R 33/307
(Continued)

OTHER PUBLICATIONS

Dietrich et al., A field camera for MR sequence monitoring and system analysis, Wiley Periodicals, Inc., Magnetic Resonance in Medicine 75 (2016) 1831-1840, Published online May 14, 2015 in Wiley Online Library (wileyonlinelibrary.com).†
(Continued)

*Primary Examiner* — Dixomara Vargas
(74) *Attorney, Agent, or Firm* — Meunier Carlin & Curfman LLC (57) ABSTRACT

In some aspects, the disclosed technology relates to magnetic field monitoring of spiral echo train imaging. In one embodiment, a method for spiral echo train imaging of an area of interest of a subject includes measuring k-space values and field dynamics corresponding to each echo of a spiral echo pulse train, using a dynamic field camera and a magnetic resonance imaging (MRI) system. The dynamic field camera is configured to measure characteristics of fields generated by the MRI system; the characteristics include at least one imperfection associated with the MRI system. The spiral echo pulse train corresponds to a spiral trajectory scan from the MRI system that obtains magnetic resonance imaging data using a pulse sequence which applies spiral gradients in-plane with through-plane phase encoding. The method also includes generating, based on the characteristics of the fields measured by the dynamic field camera and based on the obtained magnetic resonance imaging data, a model of the k-space trajectory correspond-
(Continued)

ing to each echo of the spiral echo pulse train; and, based on the generated model of the k-space trajectory, reconstructing images that correspond to the area of interest and that are compensated for the at least one imperfection associated with the MRI system.

30 Claims, 7 Drawing Sheets

(51) Int. Cl.
  *G01R 33/48* (2006.01)
  *G01R 33/565* (2006.01)

(56) References Cited

U.S. PATENT DOCUMENTS

| | | | | |
|---|---|---|---|---|
| 10,338,183 | B2* | 7/2019 | Popescu | G01R 33/4824 |
| 10,408,910 | B2* | 9/2019 | Cauley | G01R 33/4826 |
| 2007/0170917 | A1* | 7/2007 | Thompson | G01R 33/243 |
| | | | | 324/307 |
| 2015/0108984 | A1* | 4/2015 | Pfeuffer | G01R 33/307 |
| | | | | 324/322 |
| 2016/0003929 | A1* | 1/2016 | Popescu | G01R 33/4824 |
| | | | | 324/307 |
| 2017/0097403 | A1* | 4/2017 | Cauley | G01R 33/4826 |
| 2018/0120397 | A1* | 5/2018 | Kluge | G01R 33/385 |
| 2019/0175940 | A1* | 6/2019 | Hissoiny | A61N 5/1031 |

OTHER PUBLICATIONS

Brunner et al., Concurrent recording of RF pulses and gradient fields—comprehensive field monitoring for MRI, John Wiley & Sons, LTd., NMR in Biomedicine 29 (2016), 1162-1172, Published online in Wiley Online Library: Aug. 13, 2015.†

* cited by examiner
† cited by third party

MAGNETIC FIELD MONITORING OF SPIRAL ECHO TRAIN IMAGING

CROSS-REFERENCE TO RELATED APPLICATION

This application claims priority to and the benefit of U.S. Provisional Patent Application 62/482,406 filed Apr. 6, 2017, which is hereby incorporated by reference herein in its entirety as if fully set forth below.

STATEMENT OF RIGHTS UNDER FEDERALLY-SPONSORED RESEARCH

This invention was made with government support under Grant No. EB022309, awarded by the National Institutes of Health. The government has certain rights in the invention.

BACKGROUND

In spiral imaging, it is important to have an accurate estimate of the k-space trajectory. Some approaches exist for estimating the distortion of a prescribed spiral gradient waveform by eddy currents and other hardware factors. [1-4]. Many of these methods focus on spiral gradient echo acquisitions, where the phase introduced by the spiral gradients is relatively isolated between readouts. Spiral echo train imaging is a more complicated case, because errors introduced by the spiral gradients have the potential to build up during the echo train. This can cause difficulties for independently measuring the spiral k-space trajectories for each echo using conventional k-space measurement techniques.

It is with respect to these and other considerations that the various aspects of the disclosed technology as described below are presented.

SUMMARY

In some aspects, the disclosed technology relates to magnetic field monitoring of spiral echo train imaging. In one embodiment, the disclosed technology relates to a method for spiral echo train imaging of an area of interest of a subject. The method includes measuring k-space values and field dynamics corresponding to each echo of a spiral echo pulse train, using a dynamic field camera and a magnetic resonance imaging (MRI) system. The dynamic field camera is configured to measure characteristics of fields generated by the MRI system; the characteristics include at least one imperfection associated with the MRI system. The spiral echo pulse train corresponds to a spiral trajectory scan from the MRI system that obtains magnetic resonance imaging data using a pulse sequence which applies spiral gradients in-plane with through-plane phase encoding. The method also includes generating, based on the characteristics of the fields measured by the dynamic field camera and based on the obtained magnetic resonance imaging data, a model of the k-space trajectory corresponding to each echo of the spiral echo pulse train; and based on the generated model of the k-space trajectory, reconstructing images that correspond to the area of interest and that are compensated for the at least one imperfection associated with the MRI system.

In another embodiment, the disclosed technology relates to a system for spiral echo train imaging of an area of interest of a subject. The system includes a dynamic field camera and a magnetic resonance imaging (MRI) system, configured to measure k-space values and field dynamics corresponding to each echo of a spiral echo pulse train. The dynamic field camera is configured to measure characteristics of fields generated by the MRI system; the characteristics include at least one imperfection associated with the MRI system. The spiral echo pulse train corresponds to a spiral trajectory scan from the MRI system that obtains magnetic resonance imaging data using a pulse sequence which applies spiral gradients in-plane with through-plane phase encoding. The system also includes a computer-executable module configured to, when executed by at least one processor, generate a model of the k-space trajectory corresponding to each echo of the spiral echo pulse train based on the characteristics of the fields measured by the dynamic field camera and based on the obtained magnetic resonance imaging data. The system also includes a computer-executable module configured to, when executed by at least one processor, reconstruct images that correspond to the area of interest and that are compensated for the at least one imperfection associated with the MRI system, based on the generated model of the k-space trajectory.

Other aspects and features according to the example embodiments of the disclosed technology will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale.

FIG. 1 shows, for an example implementation of the disclosed technology, spiral echo train sequences characterized: for constant-density spiral-out (FIG. 1A), dual-density spiral-out (FIG. 1B), and constant-density spiral-in/out (FIG. 1C). Each sequence was also characterized with the axes swapped. The first 3 of 96 echoes are shown for each sequence. Three possible locations of the trigger sent to the field camera are shown.

FIG. 2 shows, for the example implementation corresponding also to FIG. 1, measured k-space trajectory (left) (FIGS. 2A, 2C) and corresponding errors as a function of echo number (right) (FIGS. 2B, 2D).

DETAILED DESCRIPTION

In some aspects, the disclosed technology relates to magnetic field monitoring of spiral echo train imaging. In some embodiments, systems and methods provide for spiral echo train imaging of an area of interest of a subject. Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the $n^{th}$ reference in the list. For example, [3] refers to the $3^{rd}$ reference in the list, namely Campbell-Washburn et al. All references cited and discussed in this specification are incorporated herein by reference in their entireties and to the same extent as if each reference was individually incorporated by reference.

A detailed description of aspects of the disclosed technology, in accordance with various example embodiments, will now be provided with reference to the accompanying drawings. The drawings form a part hereof and show, by way of illustration, specific embodiments and examples. In referring to the drawings, like numerals represent like elements throughout the several figures.

Various aspects of the disclosed technology recognize that good image reconstruction requires an accurate knowledge of the location in k-space. This is more complex when a series of spin echoes is collected (spiral, turbo spin echo, etc.), because any error in the gradients, such as might be caused by eddy currents, for example, will propagate to later echoes in the spin-echo pulse train. Thus, later echoes will be progressively less accurate, leading to image artifacts. Conventional measurement methods do not isolate the effects of errors in echo time interval between refocusing pulses and may mix different coherences. This can lead to a measurement that is dependent upon experimental parameters during the calibration, particularly flip angle, and thus would not be more generally applicable for different flip angles.

In accordance with some embodiments of the disclosed technology, in order to address the above-described issues and other challenges, k-space values and other parameters (e.g., B0 eddy current terms) are specifically measured for each echo separately. Based on these measurements, a mathematical model of the spiral k-space trajectory for each echo is generated, and then this k-space trajectory is used in the image reconstruction. The model accounts for the effect of the refocusing pulses, which result in moving the k-space trajectory to the complex conjugate position of the k-space position immediately prior to the refocusing pulse.

In some embodiments, echo train (e.g., turbo/fast spin echo) imaging can be combined with spiral readouts for even faster imaging that is robust in the presence of motion. A 3D pulse sequence can be used which samples in-plane k-space (kx, ky) using spiral trajectories and through-plane k-space (kz) using phase encoding (i.e., a "stack-of-spirals" pulse sequence). Along a particular spin-echo train, the same spiral is used repetitively and a series of different kz phase-encoding values are used. After subsequent excitations, different spiral interleaves are acquired. Data from all of the readouts are put together and then reconstructed. A series of k-space trajectories can thereby be produced. A simple image reconstruction that may be performed is to perform gridding to put the (kx,ky) data onto a 2D (Cartesian) grid and then perform a 3D inverse FFT (fast Fourier transform).

Figure 4:
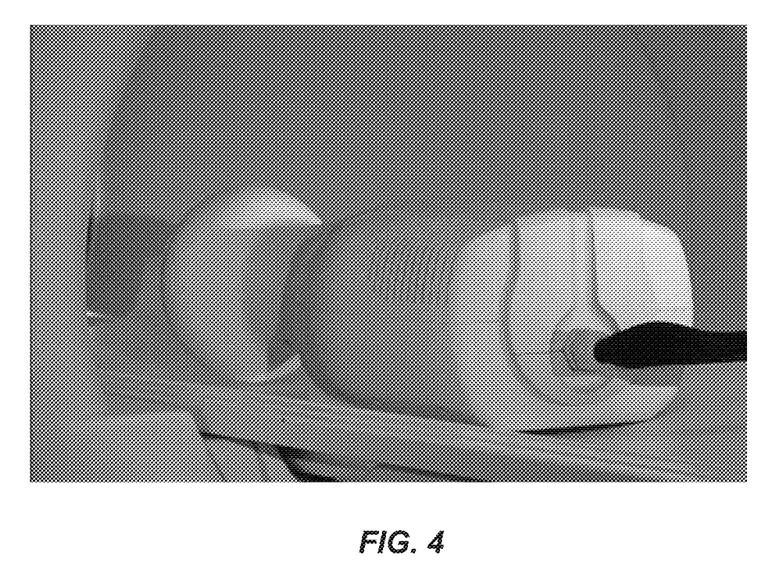
FIG. 4 shows an example dynamic field camera.
Figure 7:
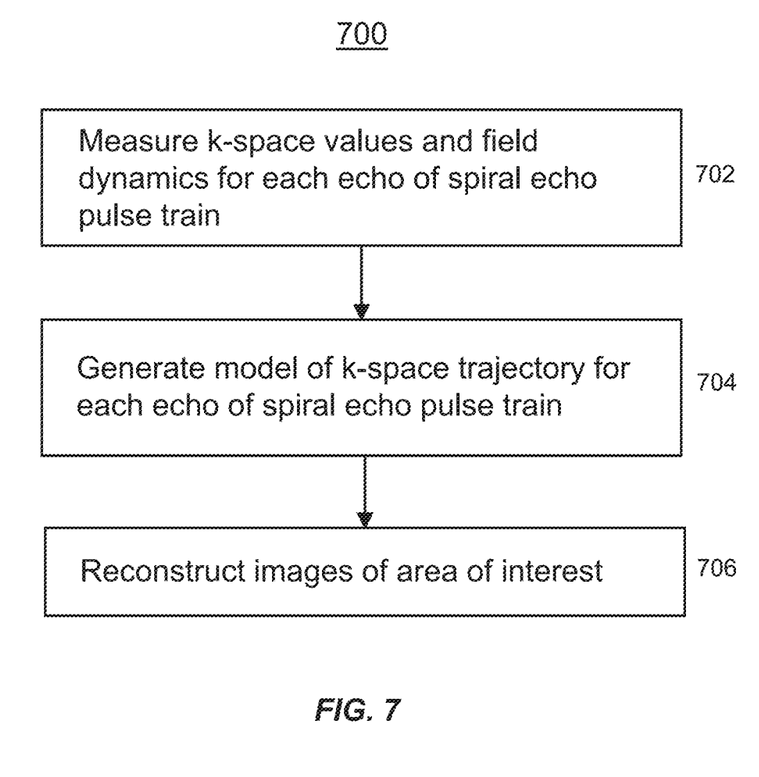
FIG. 7 is a flow diagram showing operations of a method for spiral echo train imaging of an area of interest of a subject, in accordance with an embodiment of the disclosed technology.

Now referring to the flow diagram of FIG. 7, in some aspects, the disclosed technology relates to a method 700 for spiral echo train imaging of an area of interest of a subject. The method 700 includes measuring k-space values and field dynamics corresponding to each echo of a spiral echo pulse train, using a dynamic field camera and a magnetic resonance imaging (MRI) system (step 702). The dynamic field camera is configured to measure characteristics of fields generated by the MRI system (see, e.g., FIG. 5), including at least one characteristic associated with imperfections associated with the MRI system. The dynamic field camera (for example a commercially available dynamic field camera from Skope; see FIG. 4) may comprise a plurality of nuclear magnetic resonance field probes and may be coupled with a multiple channel spectrometer, for measuring the field dynamics.

The spiral echo pulse train corresponds to a spiral trajectory scan from the MRI system that obtains magnetic resonance imaging data using a pulse sequence which applies spiral gradients in-plane with through-plane phase encoding. The method 700 also includes generating a model (step 704) of the k-space trajectory corresponding to each echo of the spiral echo pulse train, based on the characteristics of the fields measured by the dynamic field camera and based on the obtained magnetic resonance imaging data. The method also includes reconstructing images (step 706) that correspond to the area of interest and that are compensated for the at least one imperfection of the MRI system.

Characteristics of the fields that may be measured include characteristics of fields generated by the MRI system that cause artifacts or other errors in reconstructed images of the area of interest, such as image distortions. In one embodiment, measuring the characteristics of the fields includes detecting spiral gradient errors associated with gradients produced by the MRI system, and/or detecting B0 eddy currents. Detecting the spiral gradient errors can include detecting the spiral gradient errors in each of x, y, and z physical gradients. Taking measurements along a variety of different orientations can be advantageous because the gradients can have errors that are the result of eddy currents, and the eddy currents differ on different physical axes, thus using a physical x-gradient, physical y-gradient, and physical z-gradient can yield different unwanted artifacts.

In one embodiment, the fields associated with only one echo are measured during each repetition time (TR). It should also be appreciated that problems from MRI functionalities as mentioned above and as described herein may also lead to changes in actual data acquisition. K-space errors can lead to loss of coherence of the signal and thus to signal loss or artifacts. In some embodiments, measurements of such errors may be utilized in order to change design of the applied spiral gradient and/or other elements of the pulse sequence.

The spiral trajectory scan from the MRI system that obtains magnetic resonance imaging data can use a pulse sequence with a modified 3D echo train pulse sequence without RF, ADCs, and z-axis gradient waveform. In one embodiment, the k-space values and field dynamics corresponding to each echo are determined for each echo time interval between refocusing pulses. The generated model of the k-space trajectory corresponding to each echo of the spiral echo pulse train can be generated such as to account for effects of refocusing RF pulses which result in moving the k-space trajectory position immediately before a refocusing RF pulse to the complex conjugate of the k-space trajectory position immediately following the refocusing RF pulse.

In some embodiments, the spiral trajectory can be a spiral-out trajectory, spiral-out trajectory, and/or or spiral-in/out trajectory. The spiral trajectory can be a constant-density or variable density trajectory, and may be a dual density spiral trajectory. In some embodiments, the in-plane k-space trajectory is estimated based on an MR physics simulation of the echo train to estimate the k-space trajectory of a particular echo, as a function of echo time and as a function of flip angle of the refocusing pulse. Inputs to the MR physics simulation include the magnetic field measurements of every prior echo, the echo time, flip angle, resonant frequency, and relaxation times (T1, T2).

Example Implementation and Corresponding Results

The following description includes discussion of an example implementation of certain aspects of the present disclosure described above, and corresponding results. Some experimental data are presented herein for purposes of illustration and should not be construed as limiting the scope of the disclosed technology in any way or excluding any alternative or additional embodiments.

In an implementation which will now be described, the k-space trajectories of a spiral echo train pulse sequence were characterized using a dynamic field camera. As will be discussed in further detail below, the spiral trajectories were shown to be quite repeatable, with typical measured error less than 0.01% of the maximum k-space magnitude (although a somewhat larger error was typically observed in the first echo). This is shown to be true for constant-density, dual-density, and spiral-in/out trajectories.

3D spiral echo train imaging using the same k-space estimation method for all echoes was sufficient to achieve high image quality. The 3D spiral spin-echo pulse sequence that was characterized was based on a Cartesian 3D echo train pulse sequence (SPACE, Siemens), modified to repetitively acquire spiral gradients in-plane with through-plane phase encoding. The pulse sequence was adapted for use with a Skope dynamic field camera having 16 $^1$H NMR field probes and a 16-channel spectrometer for measuring field dynamics. The 16 NMR probes facilitate obtaining NMR measurements at each of 16 positions, working with 16-channels, and accordingly it may simultaneously make 16 separate dynamic field measurements. The pulse sequence was modified by eliminating the RF, ADC and the z-axis gradient waveforms. The MR functions were performed on a 3T MAGNETOM Prisma (Siemens) scanner.

Figure 1A:
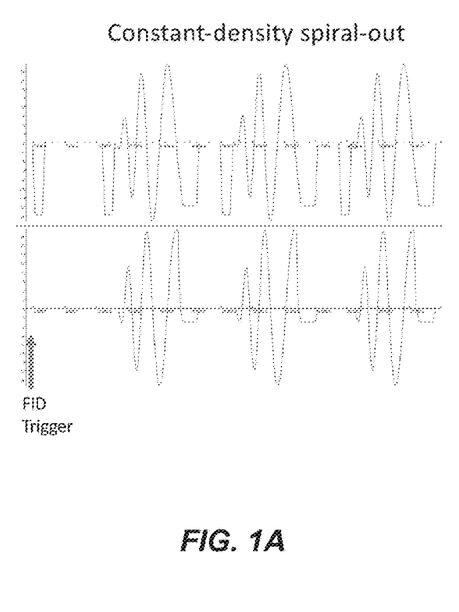
Figure 1B:
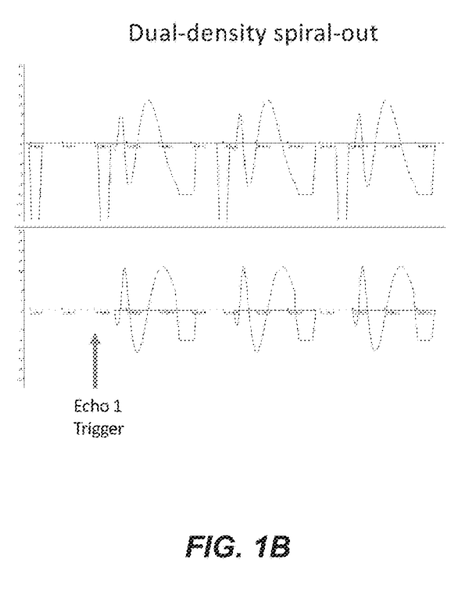
Figure 1C:
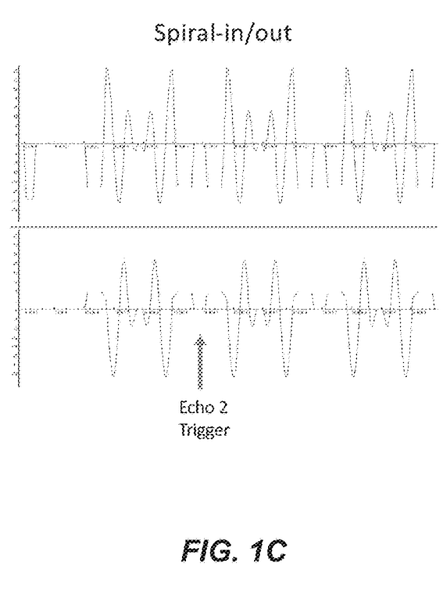

Because of signal decay, the fields associated with only one echo were measured during each TR, and the pulse sequence sent a trigger to the field camera before the relevant echo, which shifted on subsequent TRs (TR=2.5 s, 96 echoes plus 1 FID). Three different spiral designs were studied: constant-density spiral-out (FIG. 1A), dual-density spiral-out (FIG. 1B), and constant-density spiral-in/out (FIG. 1C). The first three echoes of each sequence shown are shown in FIG. 1. Each pulse sequence was measured in four orientations: transverse; transverse with X/Y gradients swapped; coronal; and coronal with X/Z gradients swapped.

The dynamic field camera measurements were processed in Matlab. The phase of the raw data from each probe was extracted, fit to spherical harmonics, and smoothed to yield (kx, ky, kz) values every microsecond. The mean of the k-space trajectories over all of the echoes was calculated, and average signed and RMS deviation of the k-space trajectory from the mean trajectory was calculated for each echo. This is a measure of the variability over the echo train of the spiral trajectory during the readout. Also, a simulation was performed in which the k-space position was inverted at each refocusing pulse to simulate the evolution of signal phase with ideal refocusing pulses.

Figure 2A:
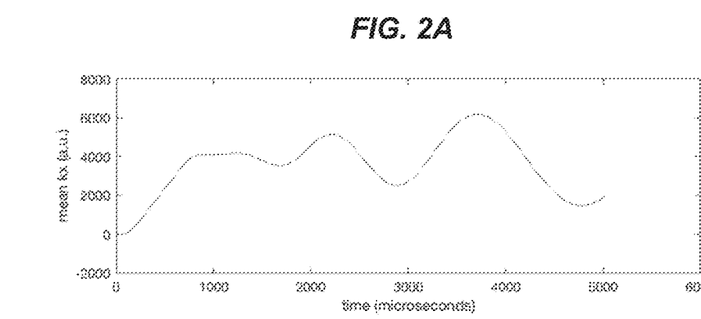
Figure 2B:
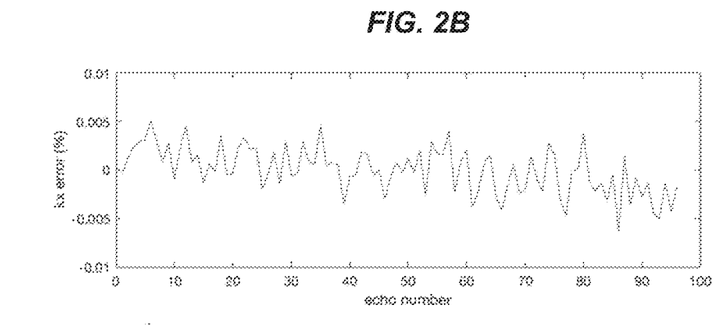
Figure 2C:
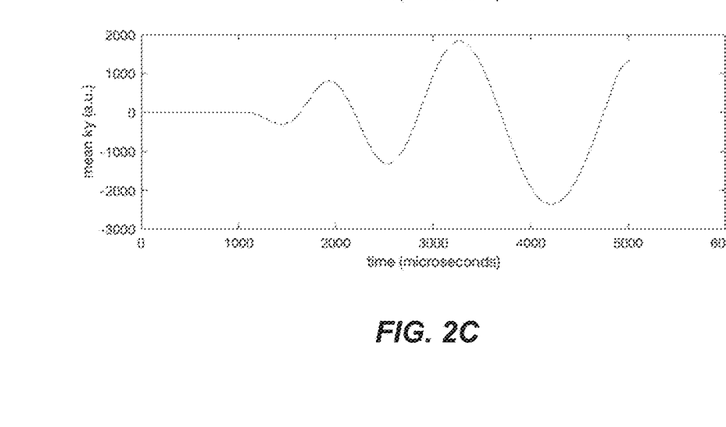
Figure 2D:
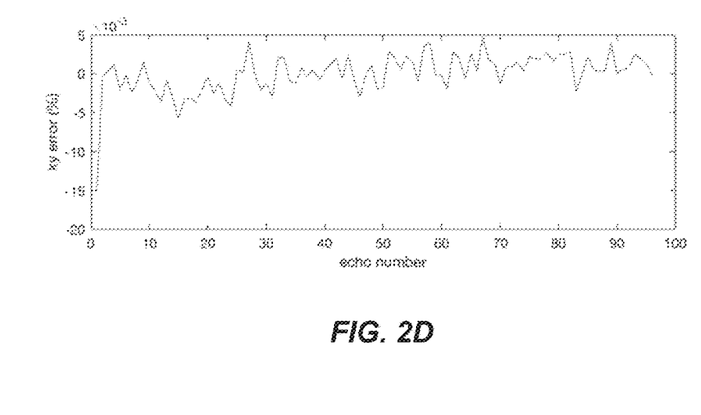
Figure 3:
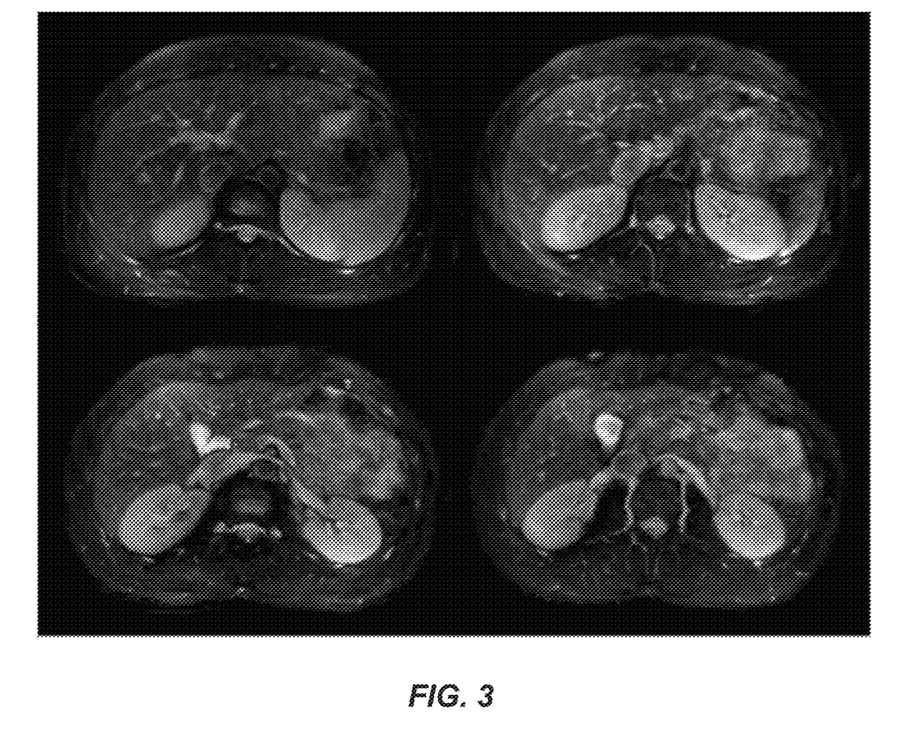
FIG. 3 shows 3D spiral echo train images of a volunteer during free breathing. There are minimal artifacts from respiratory motion, which demonstrates the motion robustness of spiral echo train imaging even without respiratory gating or motion compensation. The image reconstruction used the same spiral k-space estimation method for each echo.

Now regarding the results of the above-described implementation, each type of spiral trajectory was highly repeatable. The largest time-averaged k-space deviation for any echo (other than the first) was less than 0.01% of the maximum k-space magnitude. There were no significant differences between orientations. A typical measured trajectory (FIGS. 2A, 2C) and the corresponding signed error plot (FIGS. 2B, 2D) is given in FIG. 2. The errors were larger for many of the first echoes, with the largest error 0.05% of the maximum k-space magnitude. The errors were larger in the simulated echo train, but still on the order of 0.05% and similar to that of a control channel with no gradients applied. The buildup of errors may be due to the lower SNR at the end of the echo. FIG. 3 shows a 3D free-breathing abdominal image with the same k-space estimation method applied for each echo, demonstrating that good image quality can be achieved assuming the same spiral trajectory at each echo. As mentioned above, a larger error was typically observed in the first echo; this likely corresponded to an eddy current transient. To reduce error further, the first echo could be discarded.

Example MRI System

Figure 5:
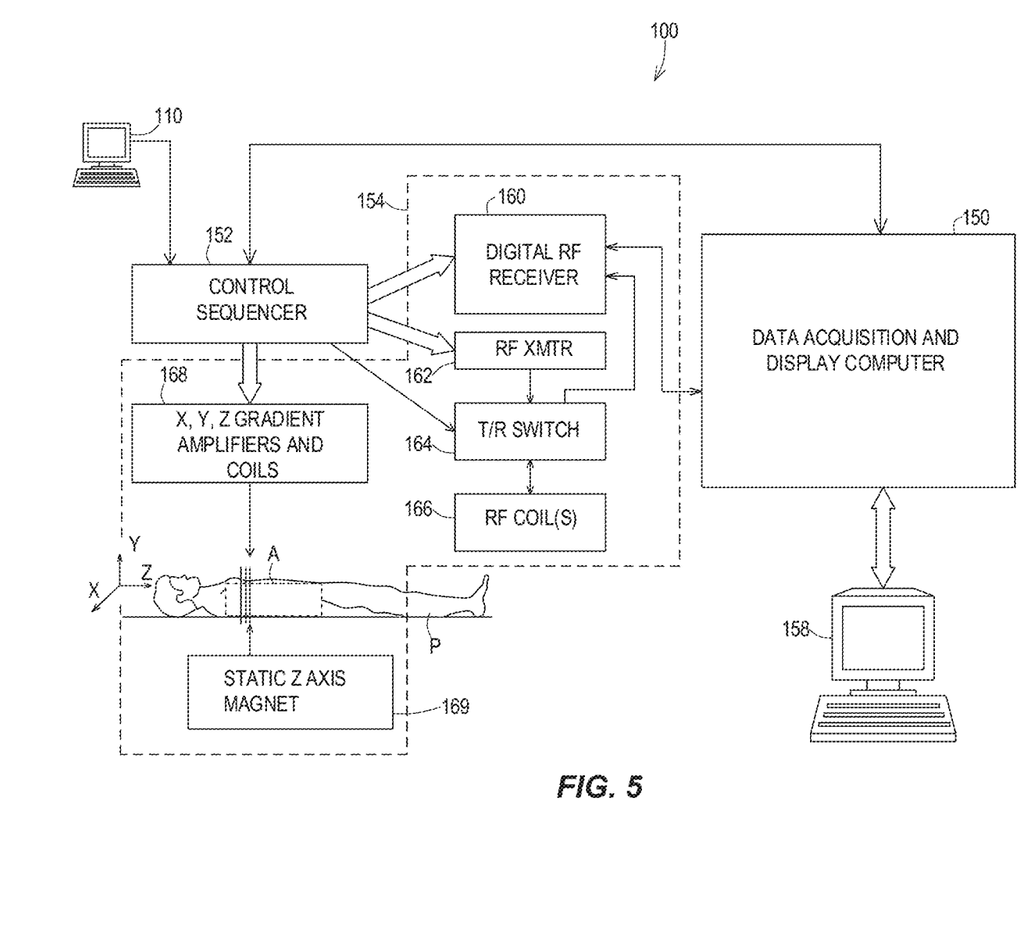
FIG. 5 is a system diagram illustrating a magnetic resonance imaging (MRI) system capable of implementing certain aspects of the disclosed technology.

FIG. 5 is a system diagram illustrating an example of a magnetic resonance imaging (MRI) system 100, including a data acquisition and display computer 150 coupled to an operator console 110, an MRI real-time control sequencer 152, and an Mill subsystem 154. The Mill subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a subject (patient) P to be imaged, for example, to implement magnetic resonance imaging sequences in accordance with various example embodiments of the disclosed technology described herein. An image of an area of interest A of the subject P (which may also be referred to herein as a "region of interest") may be shown on display 158. The display 158 may be implemented through a variety of output interfaces, including a monitor, printer, or data storage.

The area of interest A corresponds to a region associated with one or more physiological activities in subject P. The area of interest shown in FIG. 5 corresponds to a chest region of subject P, but it should be appreciated that the area of interest for purposes of implementing various aspects of the disclosure presented herein is not limited to the chest area. It should be recognized and appreciated that the area of interest in various embodiments may encompass various areas of subject P associated with various physiological characteristics, such as, but not limited to the abdominal region.

It should be appreciated that any number and type of computer-based medical imaging systems or components, including various types of commercially available medical imaging systems and components, may be used to practice certain aspects of the disclosed technology. Systems as described herein with respect to example embodiments are not intended to be specifically limited to magnetic resonance imaging (MRI) implementations or the particular system shown in FIG. 5.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the disclosed technology may include any device configured to acquire, collect, or otherwise obtain data, or to receive data from a data acquisition device within the system, an independent data acquisition device located on-site or off-site, or another data collection, storage, or processing device.

Example Computing System

Figure 6:
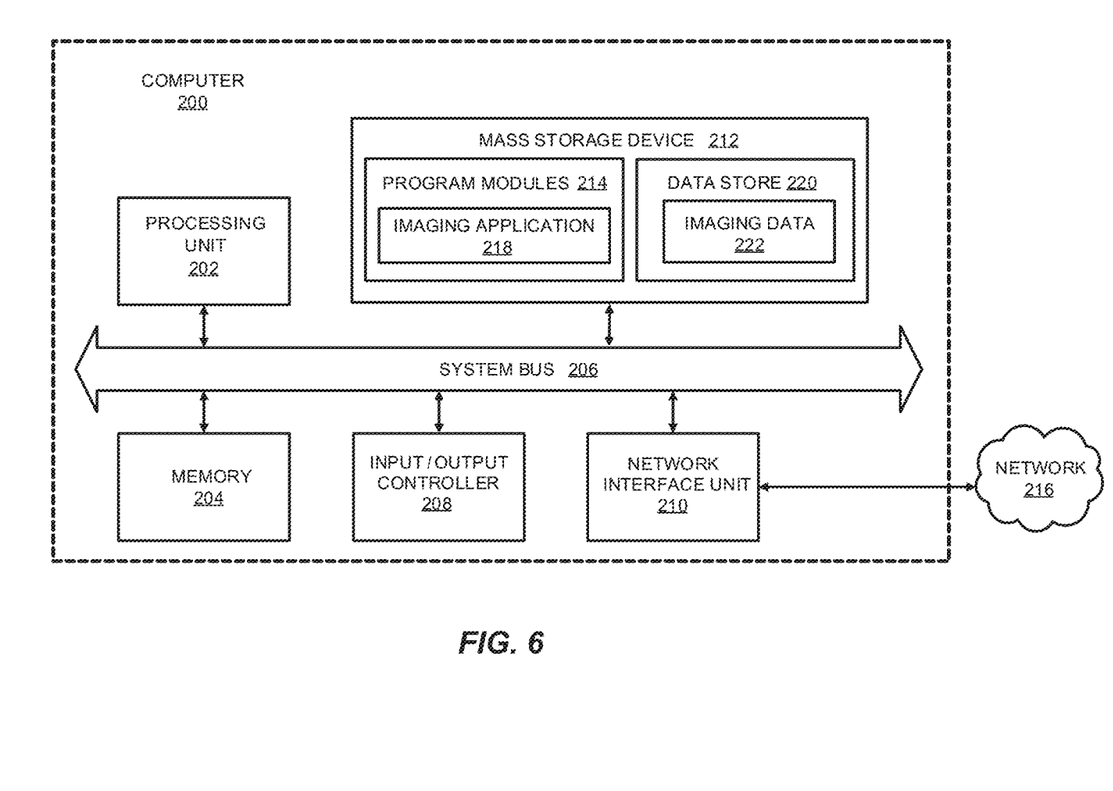
FIG. 6 is a computer architecture diagram showing a computing system capable of implementing certain aspects of the disclosed technology.

FIG. 6 is a computer architecture diagram showing a computing system capable of implementing certain aspects of the disclosed technology in accordance with one or more embodiments described herein. A computer 200 may be configured to perform one or more functions associated with embodiments described herein. It should be appreciated that the computer 200 may be implemented within a single computing device or a computing system formed with multiple connected computing devices. The computer 200 may be configured to perform various distributed computing tasks, in which processing and/or storage resources may be distributed among the multiple devices. The data acquisition and display computer 150 and/or operator console 110 of the system shown in FIG. 5 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform associated with one or more embodiments discussed above. The program modules 214 may include an imaging application 218 for performing data acquisition and/or processing functions as described herein, for example to acquire and/or process image data corresponding to magnetic resonance imaging of an area of interest. The imaging application 218 may be executed to perform some or all of the functions for generating the model of the k-space trajectory corresponding to each echo of the spiral echo pulse train, as described above with respect to certain embodiments, for example, and/or to perform image reconstruction functions as described herein. For example, the imaging application 218 may be configured with one or more computer-executable modules which, when executed by the processing unit 202, generate a model of the k-space trajectory corresponding to each echo of the spiral echo pulse train and/or, based on the generated model, reconstruct images that correspond to the area of interest. The computer 200 can include a data store 220 for storing data that may include imaging-related data 222 such as acquired data from the implementation of magnetic resonance imaging in accordance with various embodiments of the disclosed technology.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example and not limitation, computer storage media (also referred to herein as "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. "Computer storage media", "computer-readable storage medium" or "computer-readable storage media" as described herein do not include transitory signals.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems. The computer 200 may also include an input/output controller 208 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example a graphical user interface, for managing various functions performed by the computer 200. The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology.

The computer storage media may also represent secondary storage, whether implemented as hard drives or otherwise. Hard drive implementations may be characterized as solid state, or may include rotating media storing magnetically-encoded information. The program modules 214, which include the imaging application 218, may include instructions that, when loaded into the processing unit 202 and executed, cause the computer 200 to provide functions associated with one or more example embodiments and implementations discussed above. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202. Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

CONCLUSION

The various embodiments described above are provided by way of illustration only and should not be construed to limit the scope of the disclosed technology. Those skilled in the art will readily recognize that various modifications and changes may be made to the disclosed technology and are intended to be embraced within the scope of the disclosed technology. The patentable scope of certain embodiments of the disclosed technology is indicated by the appended claims, rather than the foregoing description, and all changes that come within the meaning and range of equivalents thereof are intended to be embraced therein.

REFERENCE LIST

[1] Tan H, Meyer C H. Estimation of k-space trajectories in spiral Mill. Magn Reson Med. 2009 June; 61(6):1396-404.
[2] Addy N O, Wu H H, Nishimura D G. Simple method for MR gradient system characterization and k-space trajectory estimation. Magn Reson Med. 2012 July; 68(1):120-9.
[3] Campbell-Washburn A E, Xue H, Lederman R J, Faranesh A Z, Hansen M S. Real-time distortion correction of spiral and echo planar images using the gradient system impulse response function. Magn Reson Med. 2016 June; 75(6):2278-85.
[4] Fischer R F, Barmet C, Rudin M, Boesiger P, Pruessmann K P, Kozerke S. Monitoring and compensating phase imperfections in cine balanced steady-state free precession. Magn Reson Med. 2013 December; 70(6): 1567-79.

What is claimed is:

1. A method for spiral echo train imaging of an area of interest of a subject, comprising:
measuring k-space values and field dynamics corresponding to each echo of a spiral echo pulse train, using a dynamic field camera and a magnetic resonance imaging (MRI) system,
wherein the dynamic field camera is configured to measure characteristics of fields generated by the MRI system, wherein the characteristics include at least one imperfection associated with the MRI system, and
wherein the spiral echo pulse train corresponds to a spiral trajectory scan from the MRI system that obtains magnetic resonance imaging data using a pulse sequence which applies spiral gradients in-plane with through-plane phase encoding;

generating, based on the characteristics of the fields measured by the dynamic field camera and based on the obtained magnetic resonance imaging data, a model of the k-space trajectory corresponding to each echo of the spiral echo pulse train; and based on the generated model of the k-space trajectory, reconstructing images that correspond to the area of interest and that are compensated for the at least one imperfection associated with the MRI system.

2. The method of claim 1, wherein the at least one imperfection associated with the MRI system comprises spiral gradient errors associated with gradients produced by the MRI system, and wherein measuring the characteristics of the fields comprises detecting the spiral gradient errors associated with gradients produced by the MRI system.

3. The method of claim 2, wherein detecting the spiral gradient errors comprises detecting the spiral gradient errors in each of x, y, and z physical gradients.

4. The method of claim 1, wherein the at least one imperfection associated with the MRI system comprises B0 eddy currents, and wherein measuring the characteristics of the fields comprises detecting the B0 eddy currents.

5. The method of claim 1, wherein the at least one imperfection associated with the MRI system comprise characteristics of fields generated by the MRI system that cause artifacts or other errors in reconstructed images of the area of interest, and wherein measuring the characteristics of the fields comprises detecting the characteristics of fields generated by the MRI system that cause the artifacts or other errors in the reconstructed images of the area of interest.

6. The method of claim 5, wherein the artifacts or other errors include image distortions.

7. The method of claim 1, wherein the pulse sequence comprises a modified 3D echo train pulse sequence without RF, ADCs, and z-axis gradient waveform.

8. The method of claim 1, wherein the k-space values and field dynamics corresponding to each echo are determined for each echo time interval between refocusing pulses.

9. The method of claim 1, wherein the model is generated such as to account for effects of refocusing RF pulses which result in moving the k-space trajectory position immediately before a refocusing RF pulse to the complex conjugate of the k-space trajectory position immediately following the refocusing RF pulse.

10. The method of claim 1, wherein the spiral trajectory is a spiral-out trajectory, spiral-out trajectory, or spiral-in/out trajectory.

11. The method of claim 1, wherein the spiral trajectory is a constant-density or variable density trajectory.

12. The method of claim 11, wherein the spiral trajectory is a dual density spiral trajectory.

13. The method of claim 1, comprising estimating in-plane k-space trajectory based on an MR physics simulation of the echo train to estimate the k-space trajectory of a particular echo, as a function of echo time and as a function of flip angle of the refocusing pulse.

14. The method of claim 1, wherein the dynamic field camera comprises a plurality of nuclear magnetic resonance field probes and a multiple channel spectrometer, for measuring the field dynamics.

15. The method of claim 1, wherein the fields associated with only one echo are measured during each repetition time (TR).

16. A system for spiral echo train imaging of an area of interest of a subject, comprising:

a dynamic field camera and a magnetic resonance imaging (MRI) system, configured to measure k-space values and field dynamics corresponding to each echo of a spiral echo pulse train, wherein the dynamic field camera is configured to measure characteristics of fields generated by the MRI system, wherein the characteristics include at least one imperfection associated with the MRI system, and wherein the spiral echo pulse train corresponds to a spiral trajectory scan from the MRI system that obtains magnetic resonance imaging data using a pulse sequence which applies spiral gradients in-plane with through-plane phase encoding;

a computer-executable module configured to, when executed by at least one processor, generate a model of the k-space trajectory corresponding to each echo of the spiral echo pulse train based on the characteristics of the fields measured by the dynamic field camera and based on the obtained magnetic resonance imaging data; and a computer-executable module configured to, when executed by at least one processor, reconstruct images that correspond to the area of interest and that are compensated for the at least one imperfection associated with the MRI system, based on the generated model of the k-space trajectory.

17. The system of claim 16, wherein the at least one imperfection associated with the MRI system comprises spiral gradient errors associated with gradients produced by the MRI system, and wherein measuring the characteristics of the fields comprises detecting the spiral gradient errors associated with gradients produced by the MRI system.

18. The system of claim 17, wherein detecting the spiral gradient errors comprises detecting the spiral gradient errors in each of x, y, and z physical gradients.

19. The system of claim 16, wherein the at least one imperfection associated with the MRI system comprises B0 eddy currents, and wherein measuring the characteristics of the fields comprises detecting the B0 eddy currents.

20. The system of claim 16, wherein the at least one imperfection associated with the MRI system comprises characteristics of fields generated by the MRI system that cause artifacts or other errors in reconstructed images of the area of interest, and wherein measuring the characteristics of the fields comprises detecting the characteristics of the fields generated by the MRI system that cause the artifacts or other errors in the reconstructed images of the area of interest.

21. The system of claim 20, wherein the artifacts or other errors include image distortions.

22. The system of claim 16, wherein the pulse sequence comprises a modified 3D echo train pulse sequence without RF, ADCs, and z-axis gradient waveform.

23. The system of claim 16, wherein the k-space values and field dynamics corresponding to each echo are determined for each echo time interval between refocusing pulses.

24. The system of claim 16, wherein the model is generated such as to account for effects of refocusing RF pulses which result in moving the k-space trajectory position immediately before a refocusing RF pulse to the complex conjugate of the k-space trajectory position immediately following the refocusing RF pulse.

25. The system of claim 16, wherein the spiral trajectory is a spiral-out trajectory, spiral-out trajectory, or spiral-in/out trajectory.

26. The system of claim 16, wherein the spiral trajectory is a constant-density or variable density trajectory.

27. The system of claim 26, wherein the spiral trajectory is a dual density spiral trajectory.

28. The system of claim 16, wherein estimating the k-space trajectory of a particular echo comprises estimating in-plane k-space trajectory based on an MR physics simulation of the echo train as a function of echo time and as a function of flip angle of the refocusing pulse.

29. The system of claim 16, wherein the dynamic field camera comprises a plurality of nuclear magnetic resonance field probes and a multiple channel spectrometer, for measuring the field dynamics.

30. The system of claim 16, wherein the fields associated with only one echo are measured during each repetition time (TR).

* * * * *